(12) United States Patent
Ju et al.

(10) Patent No.: US 10,972,100 B2
(45) Date of Patent: Apr. 6, 2021

(54) DIAL DEVICE

(71) Applicant: Acer Incorporated, New Taipei (TW)

(72) Inventors: Tai Ju, New Taipei (TW); Chueh-Pin Ko, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 297 days.

(21) Appl. No.: 16/236,665

(22) Filed: Dec. 31, 2018

(65) Prior Publication Data
US 2019/0379377 A1 Dec. 12, 2019

(30) Foreign Application Priority Data

Jun. 8, 2018 (TW) .................................. 107119817

(51) Int. Cl.
*H01H 9/00* (2006.01)
*H03K 17/97* (2006.01)
(Continued)

(52) U.S. Cl.
CPC .......... *H03K 17/97* (2013.01); *H01H 25/065* (2013.01); *G06F 3/0362* (2013.01); *G06F 3/0487* (2013.01); *H03K 2217/94068* (2013.01)

(58) Field of Classification Search
CPC ......... H03K 17/97; H03K 2217/94068; H01H 25/065; G06F 3/0362; G06F 3/0487
(Continued)

(56) References Cited

U.S. PATENT DOCUMENTS

| 4,176,782 | A | * | 12/1979 | Fukuda | .................. G06K 7/087 |
| | | | | | 235/449 |
| 8,138,865 | B2 | * | 3/2012 | North | ........................ G05G 5/06 |
| | | | | | 335/205 |

(Continued)

FOREIGN PATENT DOCUMENTS

| CN | 102102996 A | 6/2011 |
| CN | 205375551 U | 7/2016 |

(Continued)

OTHER PUBLICATIONS

Chinese language office action dated Sep. 17, 2018, issued in application No. TW 107119817.

*Primary Examiner* — Shawki S Ismail
*Assistant Examiner* — Lisa N Homza
(74) *Attorney, Agent, or Firm* — McClure, Qualey & Rodack, LLP

(57) ABSTRACT

A dial device includes a base, a cover, a column, a magnet, a magnetic sensor and a signal processing circuit. The cover includes a cap portion and a side wall vertically extending from the cap portion. The column surrounded by the wall includes a first end for connecting to the base and a second end for connecting to the cover. The magnet surrounds the column and is disposed on the base or the cover. The magnetic sensor is disposed on a side surface of the column and coupled to the signal processing circuit. When the cover rotates relative to the base, the magnet rotates around the magnetic sensor, and the magnetic field strengths sensed by the magnetic sensor vary. The signal processing circuit determines the relative rotation direction between the cover and the base according to the difference of the magnetic field strengths sensed by the magnetic sensor.

9 Claims, 13 Drawing Sheets

(51) Int. Cl.
*H01H 25/06* (2006.01)
*G06F 3/0487* (2013.01)
*G06F 3/0362* (2013.01)

(58) Field of Classification Search
USPC .......................................................... 335/207
See application file for complete search history.

(56) References Cited

U.S. PATENT DOCUMENTS

| | | | |
|---|---|---|---|
| 8,344,834 B2* | 1/2013 | Niiyama | G06F 3/0338 335/207 |
| 9,093,237 B2* | 7/2015 | Bondar | H01F 7/0247 |
| 2006/0250377 A1* | 11/2006 | Zadesky | G06F 3/03547 345/173 |
| 2012/0287032 A1 | 11/2012 | Olssen | |
| 2016/0091930 A1* | 3/2016 | Chen | G06F 3/041 345/173 |
| 2017/0344133 A1* | 11/2017 | Kang | G06F 3/02 |
| 2017/0350725 A1* | 12/2017 | Edwards | G01D 5/147 |
| 2019/0288687 A1* | 9/2019 | Ju | G06F 3/0362 |
| 2020/0174585 A1* | 6/2020 | Ju | G06F 3/04845 |

FOREIGN PATENT DOCUMENTS

| | | |
|---|---|---|
| TW | 201741817 A | 12/2017 |
| TW | 201816561 A | 5/2018 |

\* cited by examiner

A-A'

DIAL DEVICE

CROSS REFERENCE TO RELATED APPLICATIONS

This application claims priority of Taiwan Patent Application No. 107119817, filed on Jun. 8, 2018, the entirety of which is incorporated by reference herein.

BACKGROUND OF THE INVENTION

Field of the Invention

The present invention relates to a dial device, and more particularly to a magnetic sensing dial device that is capable of receiving many kinds of input operations.

Description of the Related Art

With the popularization of various devices using touch panels, different types of auxiliary input devices have been developed, such as the stylus. These devices allow the user to have more ways to operate his device and input data into it. For example, a dial device was introduced on the market. When a dial device is connected to an electronic product to be operated by a user, the user can input a confirmation command to the electronic product by pressing the dial device, or he can input a selection command to select an option for the menu by rotating the dial device. Therefore, how to improve the mechanical structure and circuit design of the dial device to meet the needs of the user is also a problem that urgently needs to be solved.

BRIEF SUMMARY OF THE INVENTION

A detailed description is given in the following embodiments with reference to the accompanying drawings.

The present invention has been made in view of the above problems, and proposes a magnetic sensing dial device that can receive many kinds of ways of operation input.

In the first embodiment, the invention provides a dial device including: a base, a cover, a column, one or more magnets, a magnetic sensor, and a signal processing circuit. The cover includes a cap portion and a side wall vertically extending from the cap portion. The column is surrounded by the side wall and includes a first end for connecting to the base and a second end for connecting to the cover. The magnets surround the column and are disposed on the base or the cover. The magnetic sensor is disposed on a side surface of the column. The signal processing circuit is coupled to the magnetic sensor. When the cover rotates relative to the base, the magnets will rotate around the column and the magnetic sensor, and the signal processing circuit will sense a plurality of magnetic signals having different values accordingly. The signal processing circuit determines the relative rotation direction between the cover and the base according to the plurality of magnetic signals sensed by the magnetic sensor, and outputs a clockwise rotation signal or a counterclockwise rotation signal.

In the second embodiment, the magnets comprise a first magnet that spirally surrounds the column and is disposed on the base and/or the cover.

In the third embodiment, the magnets comprise a plurality of second magnets having substantially the same magnetic field strength, the plurality of second magnets spirally surrounding the column and disposed on the base and/or the cover.

In the fourth embodiment, the magnets comprise a plurality of third magnets surrounding the column, the plurality of third magnets being substantially the same distance from the column and being disposed on the base and/or the cover. The magnetic field strengths of the plurality of third magnets appear to monotonically increase in the clockwise direction or monotonously decrease in the clockwise direction.

In the fifth embodiment, the column is fixedly connected to the base and rotatably connected to the cover. The magnets are disposed around the column and disposed on the cover. When the cover rotates relative to the base, the magnets rotate relative to the column and the magnetic sensor.

In the sixth embodiment, the column is fixedly connected to the cover and rotatably connected to the base. The magnets are disposed around the column and disposed on the base. When the cover rotates relative to the base, the magnets rotate relative to the column and the magnetic sensor.

In the seventh embodiment, the dial device further includes: a push switch electrically connected to the signal processing circuit and disposed between the cover and the column. When the cover is pressed to approach the base, the push switch is triggered, and the signal processing circuit determines that the push switch is triggered and outputs a pressing signal.

In the eighth embodiment, the dial device further includes: a push switch electrically connected to the signal processing circuit and disposed between the column and the base. When the cover is pressed to approach the base, the push switch is triggered, and the signal processing circuit determines that the push switch is triggered and outputs a pressing signal.

In the ninth embodiment, when the cover is pressed close to the base, the relative position of the magnetic sensor and the magnets are misplaced. The signal processing circuit determines that the cover and the base are relatively close to each other by using the plurality of magnetic signals sensed by the magnetic sensor, and outputs a pressing signal.

With the above embodiments, the present invention proposes a magnetic sensing dial device that can receive many kinds of operation inputs to increase functionality and convenience, and provides more diverse input modes for the user.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
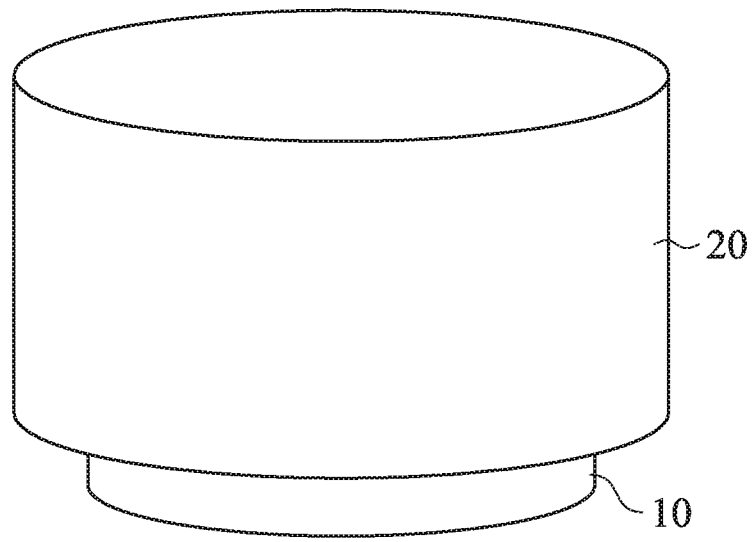
FIG. 1 shows a perspective view of a dial device in accordance with an embodiment of the present invention.

The following description provides many different embodiments or examples for implementing different features of the disclosure. Elements and arrangements in the examples below are merely used for concisely describing the present disclosure, which are not intended to limit the present disclosure. For example, the description of a structure in which a first feature is on or above a second feature includes that the first feature and the second feature are in direct contact with each other or there is another feature disposed between the first feature and the second feature such that the first feature and the second feature are not in direct contact.

The terms "first" and "second" of this specification are used only for the purpose of clear explanation and are not intended to limit the scope of the patent. In addition, terms such as "the first feature" and "the second feature" are not limited to the same or different features.

Spatially related terms, such as upper or lower, are used herein merely to describe briefly the relationship of one element or feature to another element or feature in the drawings. In addition to the directions described in the drawings, there are devices that are used or operated in different directions. The shapes, dimensions, and thicknesses in the drawings may not be drawn to scale or may be simplified for clarity of illustration, and are provided for illustrative purposes only.

FIG. 1 shows a perspective view of a dial device 1 in accordance with an embodiment of the present invention. As shown in FIG. 1, the dial device 1 of the present invention includes a base 10 and a cover 20 that covers the base 10. The cover 20 may be pressed toward the base 10 or may be rotated relative to the base 10.

When the dial device 1 is placed on a device with a touch screen, the dial device 1 communicates with the device so that the input of the dial device 1 can operate according to the image displayed on the touch screen. For example, when the dial device 1 and the device with a touch screen are connected through WIFI or Bluetooth, the touch screen may display a menu accordingly. The user selects the desired option by rotating the dial device 1, and makes a confirmation by pressing the dial device 1. In another embodiment, the bottom surface of the base 10 may also include a predetermined electrode pattern. By setting the electrode pattern, different types of touch signals generated between the electrode pattern and the touch screen are used to represent different kinds of input signals. For example, the electrode pattern is set to be or not to be in contact with the touch screen, the electrode pattern is set to generate different voltage signals, or the conductivity of the electrode pattern is set, so that the dial device 1 generates different kinds of input signals to the touch screen.

Figure 2A:
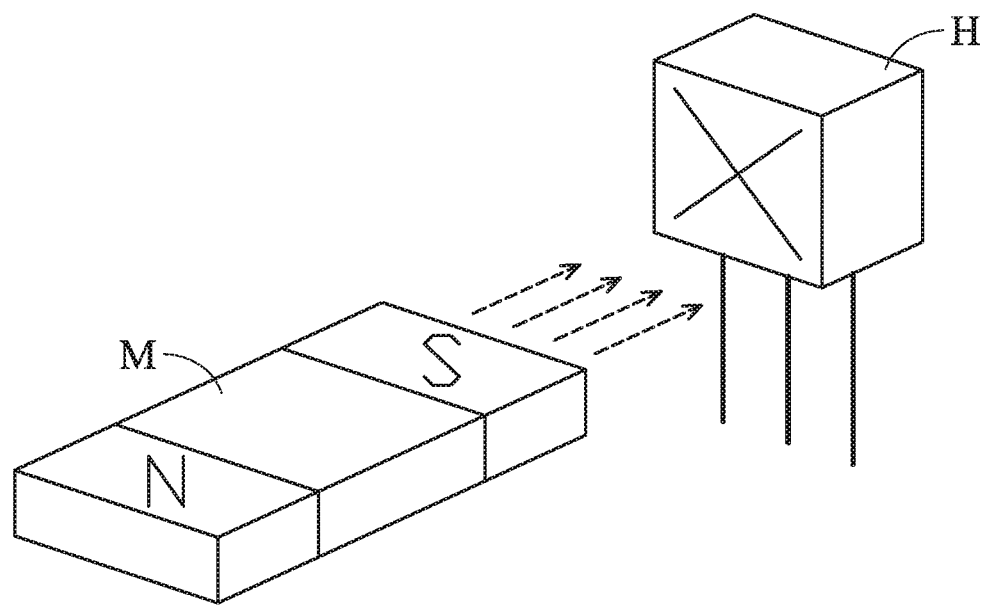
FIG. 2A shows a schematic view of a magnet and a magnetic sensor.
Figure 2B:
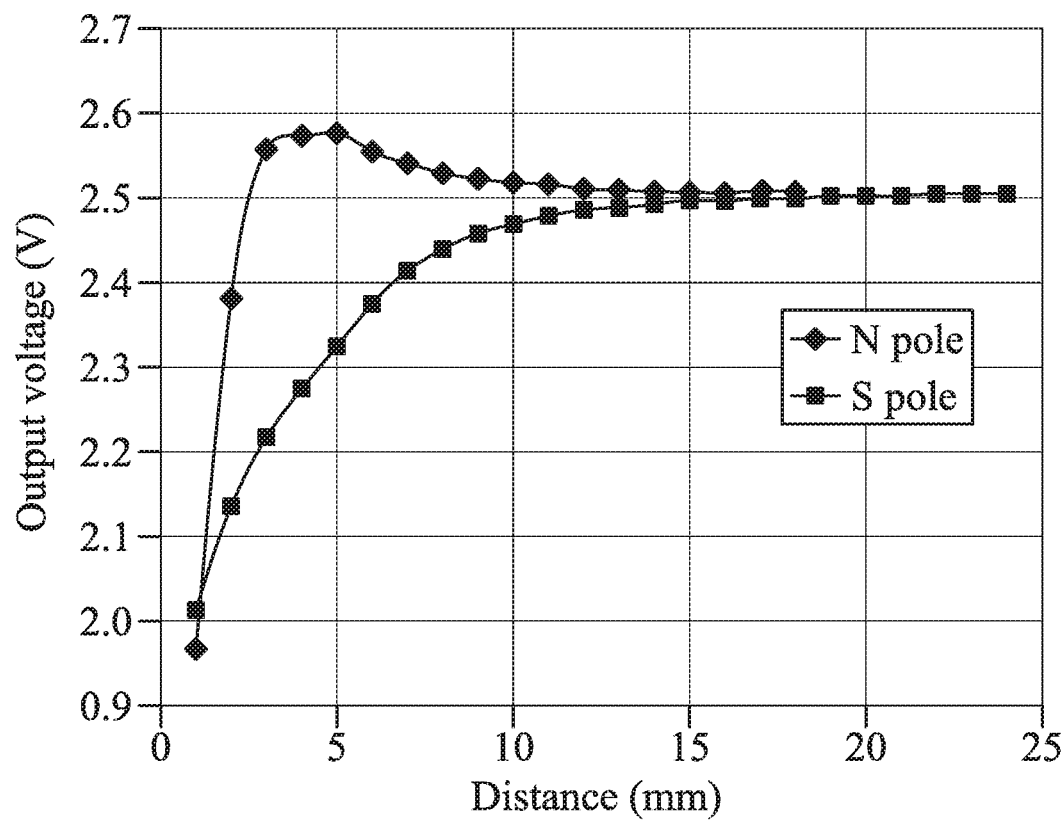
FIG. 2B shows a plot of the distance between the magnet and the magnetic sensor relative to the voltage output by the magnetic sensor.

In the following embodiments, the magnetic sensing technique is used as a detecting technique for distinguishing various input operations by the dial device. FIG. 2A shows a schematic view of a magnet and a magnetic sensor. FIG. 2B shows a plot of the distance between the magnet and the magnetic sensor relative to the voltage output by the magnetic sensor. In the embodiment of FIG. 2A, the magnetic sensor H can be implemented by using a Hall Effect sensor or the like. When the distance between the magnet M and the magnetic sensor H is different or the polarity of the magnet M is different, the magnetic field strength sensed by the magnetic sensor H is also different, and the voltage output by the magnetic sensor H also changes accordingly. As shown in FIG. 2B, the horizontal axis represents the distance of the magnet M from the magnetic sensor H, and the vertical axis represents the output voltage of the magnetic sensor H. In FIG. 2B, a plot of the output voltage of the magnetic sensor H versus the distance between the N pole of the magnet M and the magnetic sensor H is drawn, and a plot of the output voltage of the magnetic sensor H versus the distance between the S pole of the magnet M and the magnetic sensor H is drawn. In the present embodiment, since the output voltage and the distance between the N pole of the magnet M and the magnetic sensor H do not maintain a uniform change trend (As the distance between the N pole of the magnet M and the magnetic sensor H is from near to far, the corresponding output voltage of the magnetic sensor H rises first and then falls), the range of the output voltage used to detect the distance is small. Therefore, the following embodiment uses the S pole of the magnet M to sense the change of the magnetic force, so that the description is more concise and clear. In another embodiment, if the characteristic of the magnetic sensor H is different or the distance between the N pole of the magnet M and the magnetic sensor H is appropriately set, the combination of the N pole of the magnet M and the magnetic sensor can also be used to achieve the embodiments of the dial device described later.

In the following embodiments, the dial device 1 further includes a column that is fixedly connected to one of the base 10 and the cover 20 and rotatably connected to the other of the base 10 and the cover 20. Therefore, when the column is fixedly connected to the base 10 and the cover 20 is rotated relative to the base 10, the cover 20 and the column are also relatively rotated. When the column is fixedly connected to the cover 20 and the cover 20 is rotated relative to the base 10, the base 10 and the column are also relatively rotated. Furthermore, a magnetic sensor H is disposed on the lateral surface of the column and the magnet M is disposed on the base 10 and/or the cover 20. When the cover 20 is rotated relative to the base 10, the magnet M will rotate relative to the column and the magnetic sensor H. The magnetic sensor H will sense magnetic signals of different magnitudes. By judging the change in intensity between the magnetic signals, the dial device 1 can accordingly output a clockwise rotation signal or a counterclockwise rotation signal.

Figure 3A:
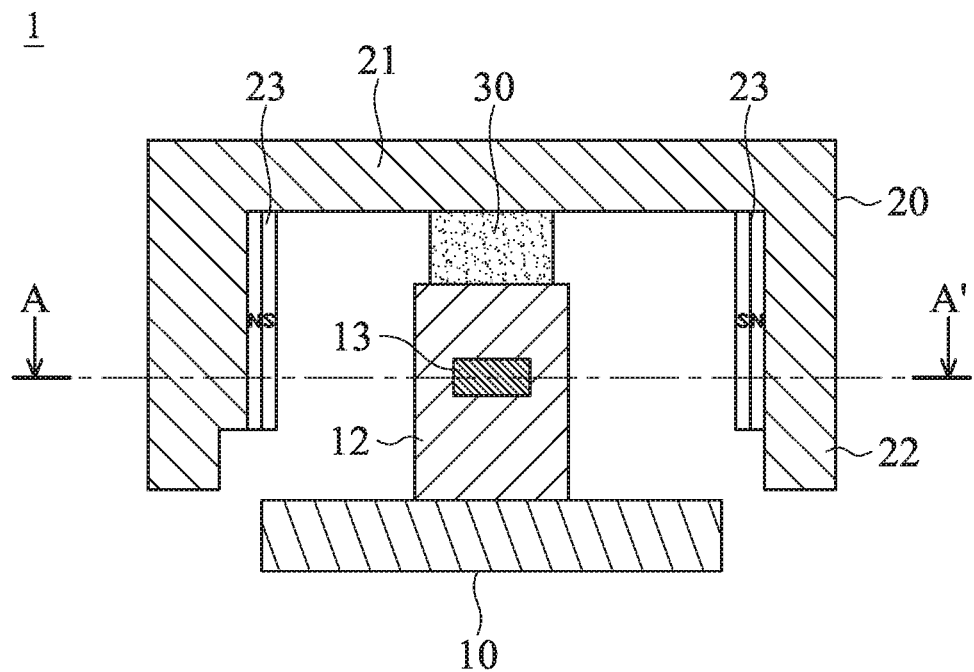
FIG. 3A is a longitudinal sectional view showing a dial device in accordance with another embodiment of the present invention.
Figure 3B:
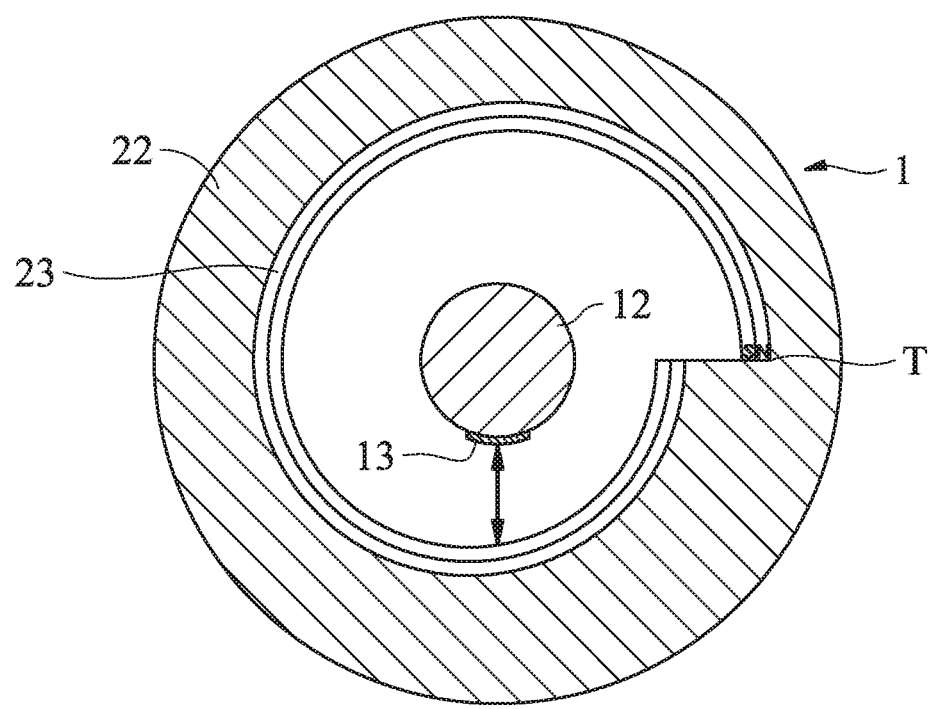
FIG. 3B is a plan view showing the cross section of the dial device of FIG. 3A taken along line A-A'.

FIG. 3A is a longitudinal sectional view showing a dial device 1 in accordance with another embodiment of the present invention. FIG. 3B is a plan view showing the cross section of the dial device 1 of FIG. 3A taken along line A-A'.

In this embodiment, the detailed structure of the dial device 1 is as shown in FIGS. 3A and 3B, and the dial device 1 includes a base 10, a column 12, a magnetic sensor 13, a magnet 23, a cover 20, and a signal processing circuit (not shown). The outer surface of the base 10 may be provided with members such as an adsorbing member or a magnet (not shown) to provide an adsorption function. Therefore, the base 10 can be fixed to a device to be operated. The outer surface of the base 10 may also be provided with an electrode pattern (not shown). The electrode pattern is disposed in contact with the device capable of sensing the electrode pattern so as to transmit or receive signals. In the present embodiment, a first end of the column 12 is fixedly connected to the inner surface of the base 10, and a second end of the column 12 is rotatably connected to the cover 20. The magnetic sensor 13 is disposed on the side surface of the column 12 to detect the magnetic force. The magnetic sensor 13 can be implemented by a Hall sensor or the like, which outputs voltage accordingly according to the magnetic field strength that is sensed. The signal processing circuit can be implemented by a microprocessor, a microcontroller, a digital signal processor, and a special application integrated circuit. The signal processing circuit is coupled to the magnetic sensor 13. The signal processing circuit determines a corresponding signal that the dial device 1 should output based on the change in the output voltage of the magnetic sensor 13. In this embodiment, the base 10 and the column 12 are in a cylindrical shape. In other embodiments, the base 10 and the column 12 may be in other appropriate shapes or sizes (for example, a triangle or a square), only if the relative rotation between the cover 20 and the base 10 is not hindered. In addition, the side surface of the column 12 may also be provided with a groove to accommodate the magnetic sensor 13, or the magnetic sensor 13 may be covered under the surface of the side surface of the column 12.

In the present embodiment, the cover 20 includes a cap portion 21 and a side wall 22 vertically extending from the cap portion 21. The inner surface of the cap portion 21 is rotatably connected to the second end of the column 12, and the column 12 is surrounded by the side wall 22. For example, the cap portion 21 and the column 12 may have an axis and a corresponding receiving hole (none of which are shown) to achieve a rotatable connection. In the present embodiment, starting from the end point T, the thickness of the side wall 22 increases monotonically in the counterclockwise direction. The magnet 23 is disposed along the circumferential direction of the inner wall of the side wall 22 to spirally surround the column 12. The magnet 23 can be fixed to the side wall 22 by an adhesive or a connecting member. As shown in FIG. 3B, the magnet 23 gradually approaches the column 12 in the counterclockwise direction. The side of the magnet 23 facing the column 12 is disposed with the S pole of the magnet 23, and the side of the magnet 23 facing the side wall 22 is disposed with the N pole of the magnet 23. The magnetic field strength of the magnet 23 on the side facing the column 12 is set to be uniform. The magnetic field strength sensed by the magnetic sensor 13 is mainly determined by the distance between the magnetic sensor 13 and the magnet 23. In other embodiments, the cap portion 21 and the side wall 22 of the cover 20 may also be of different shapes or sizes depending on design considerations such as ergonomics. For example, the outer surface of the cap portion 21 and the outer surface of the side wall 22 may be disposed with a recessed area for facilitating the user's finger pressing or holding. There may also be different angles between the side wall 22 and the cap portion 21. The cap portion 21 and the side wall 22 may not be completely sealed. In other embodiments, the side wall 22 of the cover 20 may also be provided with a uniform thickness, and one or more connecting members (not shown) are used to fix the magnet 23 so that the magnet 23 is arranged in such a manner as to gradually approach the column 12. In other embodiments, the thickness of the sidewall 22 can also be set to monotonically increase in the clockwise direction or monotonically decrease in the clockwise direction.

In the present embodiment, an elastic body 30 is further disposed between the column 12 and the cap portion 21. When the cover 20 is pressed, the base 10 and the cover 20 can approach each other by the compression elastic body 30. In addition, the dial device 1 may further include a push switch (not shown) electrically connected to the signal processing circuit for detecting a pressing operation of the user, so that the signal processing circuit can output a pressing signal accordingly. For example, the push switch can be disposed at the elastic body 30. When the user presses the cover 20, the elastic body 30 is compressed so that the distance between the cover 20 and the base 10 becomes close and the push switch is triggered. The signal processing circuit determines that the push switch is triggered, and outputs a pressing signal accordingly. When the pressing force applied to the dial device 1 disappears, the base 10 and the cover 20 are returned to the preset distance due to the elastic force of the elastic body 30, and the push switch is in an un-triggered state.

In a state where the dial device 1 is not applied with a force (in a state not operated by the user), as shown in FIG. 3A, a sensing surface of the magnetic sensor 13 (i.e., an area of the magnetic sensor 13 that is mainly used for detecting the magnetic field) faces the magnet 23. As also shown in FIG. 3B, the magnet 23 has a spiral structure that gradually approaches the column 12 along the counterclockwise direction. The magnetic field strength sensed by the magnetic sensor 13 is varied by the distance between the sensing surface of the magnetic sensor 13 and the helical magnet 23 (for example, the length of the arrow in FIG. 3B). The closer the magnetic sensor 13 is to the helical magnet 23, the stronger the magnetic field strength is sensed and the lower the voltage that is output. Conversely, the farther the magnetic sensor 13 is from the helical magnet 23, the weaker the magnetic field strength is sensed and the higher the voltage that is output.

In the embodiment of FIG. 3B, when the user rotates the dial device 1 in the clockwise direction, the cover 20 rotates clockwise relative to the base 10. The distance between the magnetic sensor 13 and the magnet 23 is gradually decreased, the magnetic field strength sensed by the magnetic sensor 13 is gradually increased, and the corresponding magnetic signal (i.e., the output voltage) is gradually decreased. According to the gradual decrease of the magnetic signal output by the magnetic sensor 13, the signal processing circuit accordingly outputs a clockwise rotation signal to the external device. In addition, in order to improve the accuracy of the detection, the magnetic sensor 13 can be set to sense the enhanced magnetic field strength at least two consecutive times, so that the magnetic sensor 13 decreases the magnetic signal at least two consecutive times. Then the signal processing circuit determines that the dial device 1 is rotated in the clockwise direction and outputs a clockwise rotation signal to the external device. On the other hand, when the user rotates the dial device 1 in the counterclockwise direction, the cover 20 rotates counterclockwise relative to the base 10. The distance between the magnetic sensor 13 and the magnet 23 is gradually increased, the magnetic field strength sensed by the magnetic sensor 13 is gradually decreased, and the corresponding magnetic signal (i.e., the output voltage) is gradually increased. According to the gradual increase of the magnetic signal output by the magnetic sensor 13, the signal processing circuit accordingly outputs a counterclockwise rotation signal to the external device. In addition, in order to improve the accuracy of the detection, the magnetic sensor 13 can be set to sense the weakened magnetic field strength at least two consecutive times, so that the magnetic sensor 13 increases the magnetic signal at least two consecutive times. Then the signal processing circuit determines that the dial device 1 is rotated in the counterclockwise direction and outputs a counterclockwise rotation signal to the external device. Furthermore, the signal processing circuit can also determine the rotation angle of the dial device 1 based on how much the magnetic signal output from the magnetic sensor 13 has changed. At the end point T of the embodiment, the change in the distance between the magnetic sensor 13 and the magnet 23 is a sudden increase along the counterclockwise direction, which is different from that at the other portions that is monotonically decreased along the counterclockwise direction. Therefore, using an algorithm, the signal processing circuit can treat this region as a special case to output a correct clockwise rotation signal or a counterclockwise rotation signal. For example, only when the output voltages of the magnetic sensor 13 are both increased or decreased two consecutive times does the signal processing circuit determine whether to output a clockwise rotation signal or a counterclockwise rotation signal.

Figure 4A:
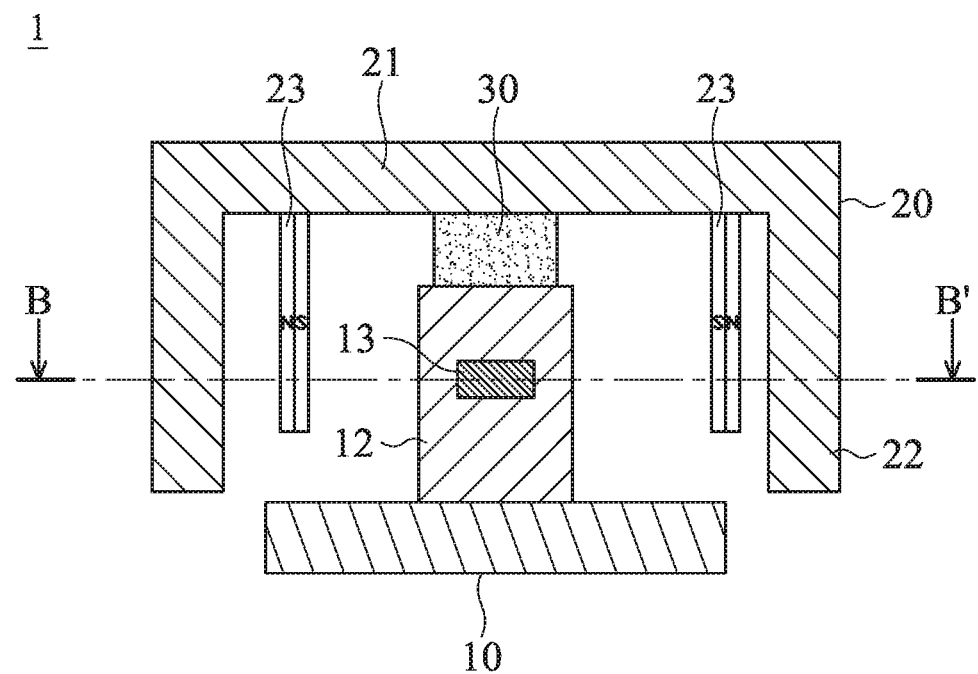
FIG. 4A is a longitudinal sectional view showing a dial device in accordance with another embodiment of the present invention.
Figure 4B:
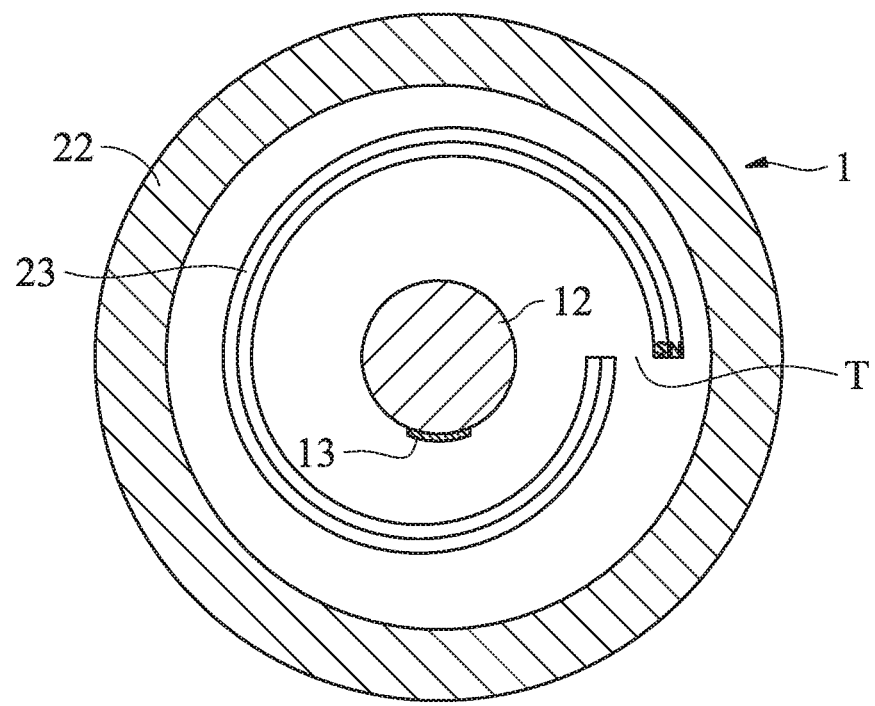
FIG. 4B is a plan view showing the cross section of the dial device of FIG. 4A taken along line B-B'.

FIG. 4A is a longitudinal sectional view showing a dial device in accordance with another embodiment of the present invention. FIG. 4B is a plan view showing the cross section of the dial device of FIG. 4A taken along line B-B'. The embodiment of FIGS. 4A and 4B is mostly the same as the embodiment of FIGS. 3A and 3B. The main difference is that the magnet 23 is fixed to the cover 20 in the manner of gradually approaching the column 12 along the counterclockwise direction, the cap portion 21 of the cover 20 and the magnet 23 may be fixed by using an adhesive or a physical structure (for example, a structure such as a receiving groove, a snap member, etc.; not shown), and the side wall 22 is provided to have a uniform thickness. In the embodiment of FIGS. 4A and 4B, the other elements of the dial device 1 and the operation methods are the same as or similar to those of the embodiment of FIGS. 3A and 3B, so that the same element symbols are denoted and the description thereof will not be repeated.

In the above embodiment, the magnetic field strength of the magnet 23 on the side facing the column 12 is set to be an even distribution. In other embodiments, the magnetic field strength of the magnet 23 facing the column 12 may also be set to an uneven distribution. For example, starting from the end point T, the magnetic field strength of the magnet 23 is set to monotonically increase in the counterclockwise direction. Thus, when the cover 20 is rotated relative to the base 10, the magnetic sensor 13 can accordingly sense a change in the magnetic field strength, enabling the signal processing circuit to output a correct clockwise rotation signal or a counterclockwise rotation signal. In other embodiments, the magnetic field strength of the magnet 23 can also be set to monotonically increase in the clockwise direction or monotonically decrease in the clockwise direction.

Figure 5A:
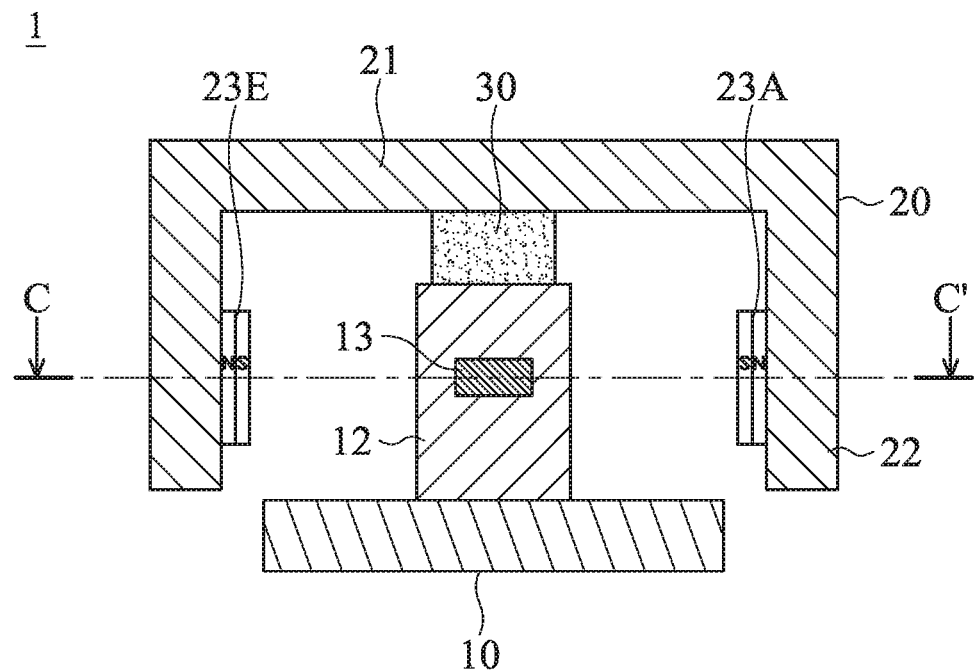
FIG. 5A is a longitudinal sectional view showing a dial device in accordance with another embodiment of the present invention.
Figure 5B:
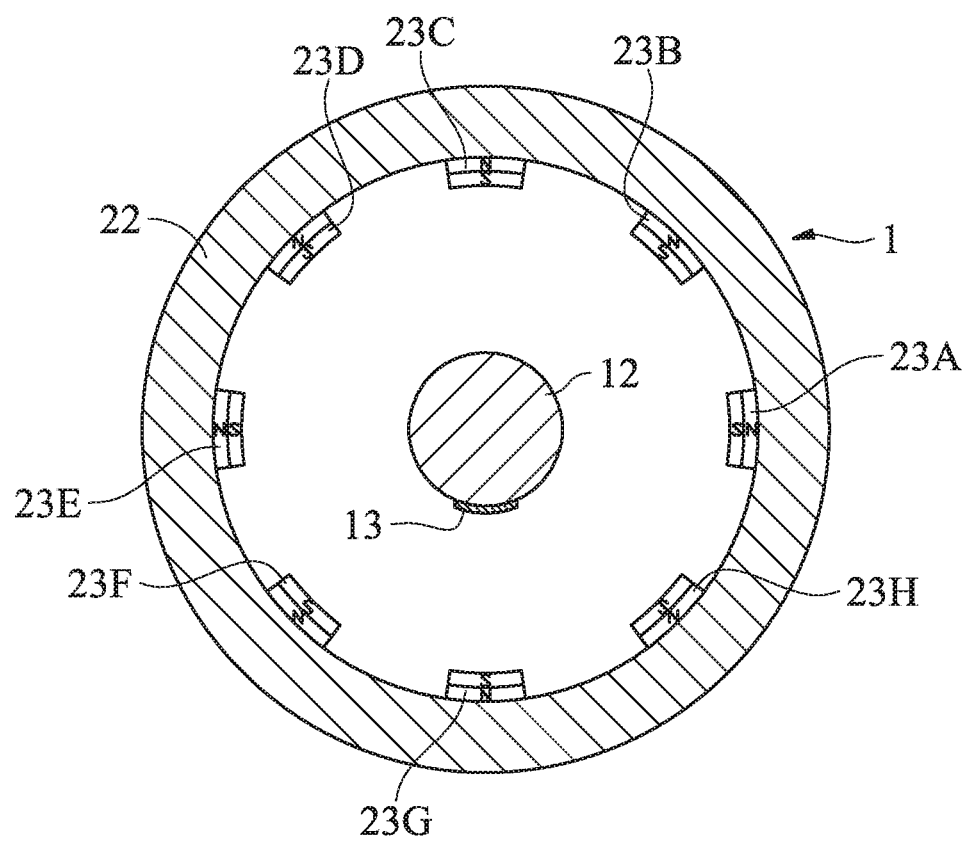
FIG. 5B is a plan view showing the cross section of the dial device of FIG. 5A taken along line C-C'.

In the above embodiment, one magnet 23 is used to surround the column in a spiral manner. However, a plurality of magnets may be used to surround the column. FIG. 5A is a longitudinal sectional view showing a dial device in accordance with another embodiment of the present invention. FIG. 5B is a plan view showing the cross section of the dial device of FIG. 5A taken along line C-C'. In the present embodiment, the detailed structure of the dial device 1 is as shown in FIGS. 5A and 5B. The magnet 23 of the foregoing embodiment is modified by a plurality of magnets 23A to 23H having different magnetic field strengths, and the side wall 22 is set to a uniform thickness. The rest of the structure is the same as that of the embodiment of FIGS. 3A and 3B, and the same element symbol is denoted. As shown in FIG. 5B, eight magnets 23A to 23H having different magnetic field strengths are arranged at equal intervals in the circumferential direction of the inner wall surface of the side wall 22 of the cover 20 in order of magnetic field strength. Each of the magnets 23A to 23H faces the column 12 with the S pole of the magnet. Although the distance between the magnets 23A to 23H and the magnetic sensor 13 is not changed, since the magnetic field strength of each of the magnets 23A to 23H itself is different, the magnetic sensor 13 can also sense an enhanced or weakened magnetic signal when the dial device 1 is rotated. Therefore, according to the same manner as the embodiment of FIGS. 3A and 3B, the signal processing circuit determines that the dial device 1 is rotated counterclockwise or clockwise (i.e., in FIG. 5B, the cover 20 is rotated counterclockwise or clockwise relative to the base 10) and outputs a counterclockwise rotation or a clockwise rotation signal to the external device. In other embodiments, the number of magnets may also be increased or decreased according to different design considerations. The magnets may be arranged at different intervals on the inner wall surface of the side wall 22 of the cover 20 in order of magnetic field strength. In other embodiments, a plurality of magnets of the same magnetic field strength may also be disposed on the side wall 22 of the cover 20, and the thickness of the side wall 22 is set to be uneven (as shown in FIG. 3B). This can also achieve the technical effects of the above embodiments.

Figure 6A:
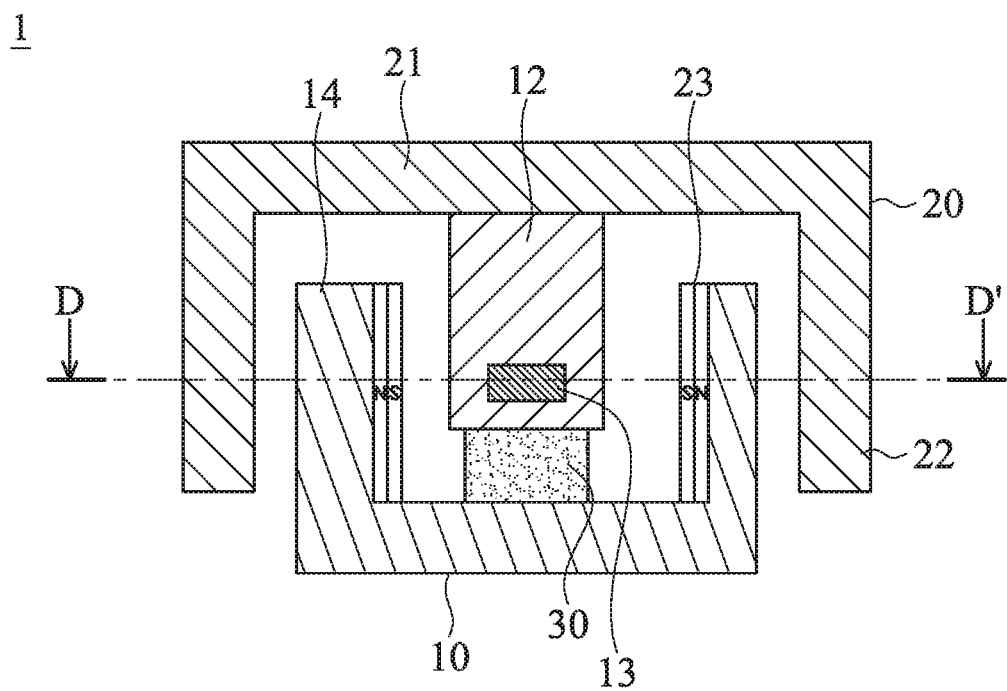
FIG. 6A is a longitudinal sectional view showing a dial device in accordance with another embodiment of the present invention.
Figure 6B:
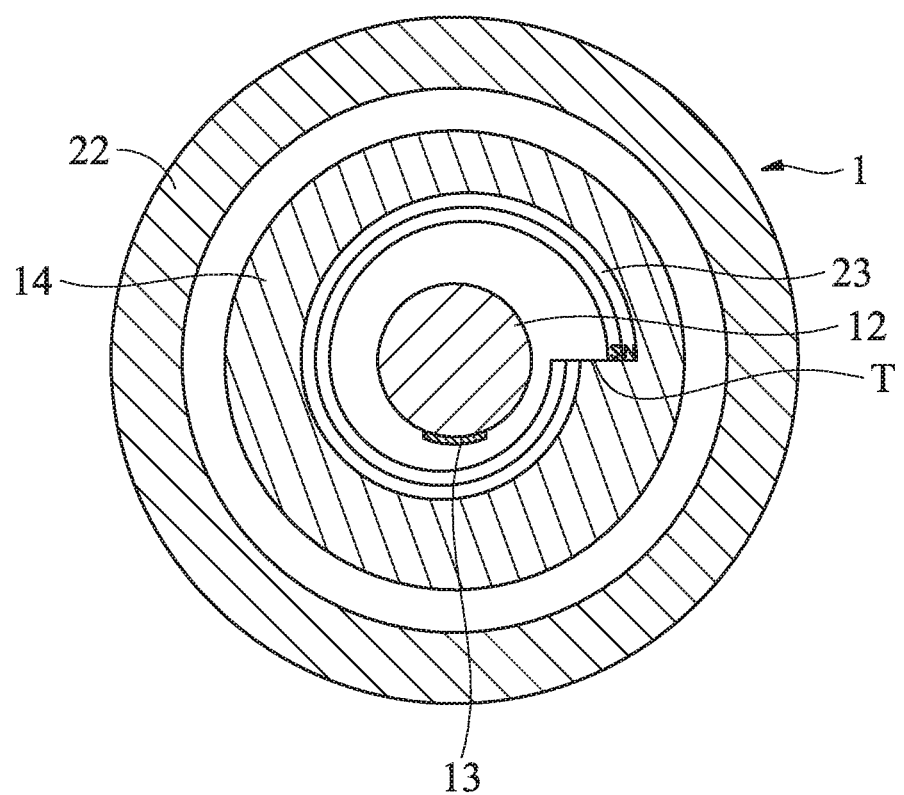
FIG. 6B is a plan view showing the cross section of the dial device of FIG. 6A taken along line D-D'.

FIG. 6A is a longitudinal sectional view showing a dial device in accordance with another embodiment of the present invention. FIG. 6B is a plan view showing the cross section of the dial device of FIG. 6A taken along line D-D'. In this embodiment, the detailed structure of the dial device 1 is as shown in FIGS. 6A and 6B, and the dial device 1 includes a base 10, a column 12, a magnetic sensor 13, a magnet 23, a cover 20, and a signal processing circuit (not shown). The base 10 further includes a side wall 14 that extends upward from an inner surface of the base 10. In the present embodiment, a first end of the column 12 is rotatably connected to the base 10, and a second end of the column 12 is fixedly connected to the cover 20. In this embodiment, the base 10 and the column 12 are in a cylindrical shape. In other embodiments, the base 10 and the column 12 may be in other appropriate shapes or sizes (for example, a triangle or a square), only if the relative rotation between the cover 20 and the base 10 is not hindered.

In the present embodiment, the cover 20 includes a cap portion 21 and a side wall 22 vertically extending from the cap portion 21. The inner surface of the cap portion 21 is fixedly connected to the second end of the column 12, and the column 12 is surrounded by the side wall 22. The magnetic sensor 13 is disposed on the side surface of the column 12 to detect the magnetic force. The magnetic sensor 13 can be implemented by a Hall sensor or the like, which outputs voltage accordingly according to the magnetic field strength that is sensed. The signal processing circuit can be implemented by a microprocessor, a microcontroller, a digital signal processor, and a special application integrated circuit. The signal processing circuit is coupled to the magnetic sensor 13. The signal processing circuit determines a corresponding signal that the dial device 1 should output based on the change in the output voltage of the magnetic sensor 13.

The base 10 and the column 12 may have an axis and a corresponding receiving hole (none of which are shown) to achieve a rotatable connection. In the present embodiment, starting from the end point T, the thickness of the side wall 14 increases monotonically in the counterclockwise direction. The magnet 23 is disposed along the circumferential direction of the inner wall of the side wall 14 to spirally surround the column 12. As shown in FIG. 6B, the magnet 23 gradually approaches the column 12 in the counterclockwise direction. The side of the magnet 23 facing the column 12 is disposed with the S pole of the magnet 23, and the side of the magnet 23 facing the side wall 14 is disposed with the N pole of the magnet 23. The magnetic field strength of the magnet 23 on the side facing the column 12 is set to be uniform. The magnetic field strength sensed by the magnetic sensor 13 is mainly determined by the distance between the magnetic sensor 13 and the magnet 23. In other embodiments, the side wall 14 of the base 10 may also be provided with a uniform thickness, and one or more connecting members (not shown) are used to fix the magnet 23 so that the magnet 23 is arranged in such a manner as to gradually approach the column 12. In other embodiments, the thickness of the sidewall 14 can also be set to monotonically increase in the clockwise direction or monotonically decrease in the clockwise direction. In other embodiments, the base 10 may not be provided with the side wall 14, but the base 10 and the magnet 23 may be fixed by an adhesive or a physical structure (for example, a structure such as a receiving groove or a snap member; not shown), such that the magnet 23 is disposed in a spiral shape gradually closer to the column 12.

In the present embodiment, an elastic body 30 is further disposed between the column 12 and the base 20. When the cover 20 is pressed, the base 10 and the cover 20 can approach each other by the compression elastic body 30. In addition, the dial device 1 may further include a push switch (not shown) electrically connected to the signal processing circuit for detecting a pressing operation of the user, so that the signal processing circuit can output a pressing signal accordingly. For example, the push switch can be disposed at the elastic body 30. When the user presses the cover 20, the elastic body 30 is compressed so that the distance between the cover 20 and the base 10 becomes close and the push switch is triggered. The signal processing circuit determines that the push switch is triggered, and outputs a pressing signal accordingly. When the pressing force applied to the dial device 1 disappears, the base 10 and the cover 20 are returned to the preset distance due to the elastic force of the elastic body 30, and the push switch is in an untriggered state.

In a state where the dial device 1 is not applied with a force (in a state not operated by the user), as shown in FIG. 6A, a sensing surface of the magnetic sensor 13 (i.e., an area of the magnetic sensor 13 that is mainly used for detecting the magnetic field) faces the magnet 23. As also shown in FIG. 6B, the magnet 23 has a spiral structure that gradually approaches the column 12 along the counterclockwise direction. The magnetic field strength sensed by the magnetic sensor 13 is varied by the distance between the sensing surface of the magnetic sensor 13 and the helical magnet 23. The closer the magnetic sensor 13 is to the helical magnet 23, the stronger the magnetic field strength is sensed and the lower the voltage that is output. Conversely, the farther the magnetic sensor 13 is from the helical magnet 23, the weaker the magnetic field strength is sensed and the higher the voltage that is output.

In the embodiment of FIG. 6B, when the user rotates the dial device 1 in the clockwise direction, the cover 20 rotates clockwise relative to the base 10. The distance between the magnetic sensor 13 and the magnet 23 is gradually increased, the magnetic field strength sensed by the magnetic sensor 13 is gradually decreased, and the corresponding magnetic signal (i.e., the output voltage) is gradually increased. According to the gradual increase of the magnetic signal output by the magnetic sensor 13, the signal processing circuit accordingly outputs a clockwise rotation signal to the external device. In addition, in order to improve the accuracy of the detection, the magnetic sensor 13 can be set to sense the weakened magnetic field strength at least two consecutive times, so that the magnetic sensor 13 increases the magnetic signal at least two consecutive times. Then the signal processing circuit determines that the dial device 1 is rotated in the clockwise direction and outputs a clockwise rotation signal to the external device. On the other hand, when the user rotates the dial device 1 in the counterclockwise direction, the cover 20 rotates counterclockwise relative to the base 10. The distance between the magnetic sensor 13 and the magnet 23 is gradually decreased, the magnetic field strength sensed by the magnetic sensor 13 is gradually increased, and the corresponding magnetic signal (i.e., the output voltage) is gradually decreased. According to the gradual decrease of the magnetic signal output by the magnetic sensor 13, the signal processing circuit accordingly outputs a counterclockwise rotation signal to the external device. In addition, in order to improve the accuracy of the detection, the magnetic sensor 13 can be set to sense the enhanced magnetic field strength at least two consecutive times, so that the magnetic sensor 13 decreases the magnetic signal at least two consecutive times. Then the signal processing circuit determines that the dial device 1 is rotated in the counterclockwise direction and outputs a counterclockwise rotation signal to the external device. Furthermore, the signal processing circuit can also determine the rotation angle of the dial device 1 based on how much the magnetic signal output from the magnetic sensor 13 has changed. At the end point T of the embodiment, the change in the distance between the magnetic sensor 13 and the magnet 23 is a sudden decrease along the counterclockwise direction, which is different from that at the other portions that is monotonically increased along the counterclockwise direction. Therefore, using an algorithm, the signal processing circuit can treat this region as a special case to output a correct clockwise rotation signal or a counterclockwise rotation signal. For example, only when the output voltages of the magnetic sensor 13 are both increased or decreased two consecutive times does the signal processing circuit determine whether to output a clockwise rotation signal or a counterclockwise rotation signal.

Figure 7A:
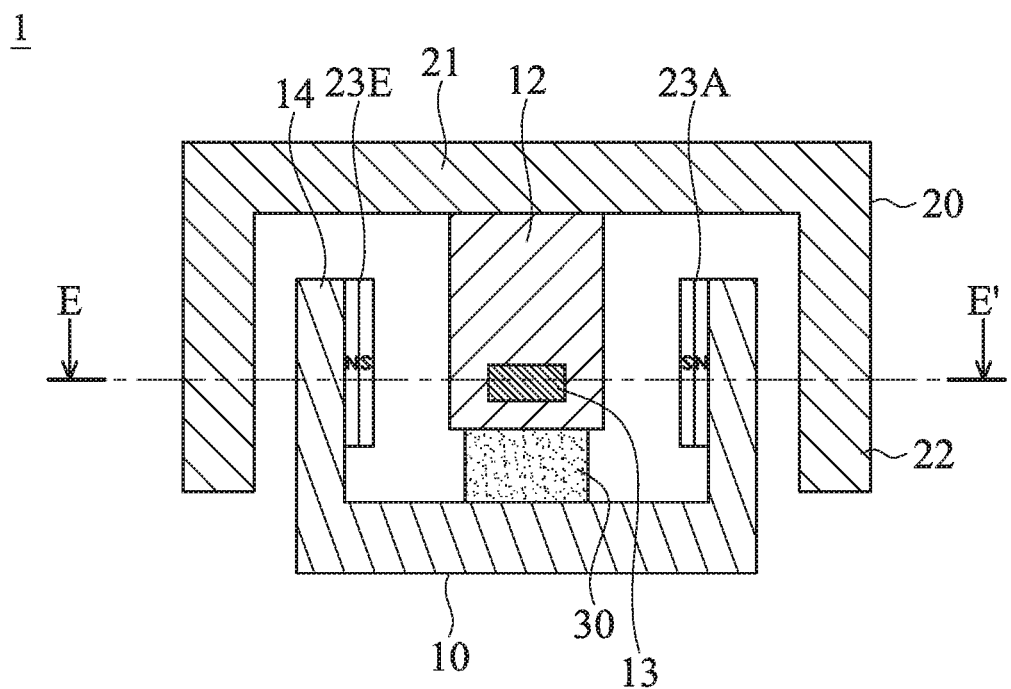
FIG. 7A is a longitudinal sectional view showing a dial device in accordance with another embodiment of the present invention.
Figure 7B:
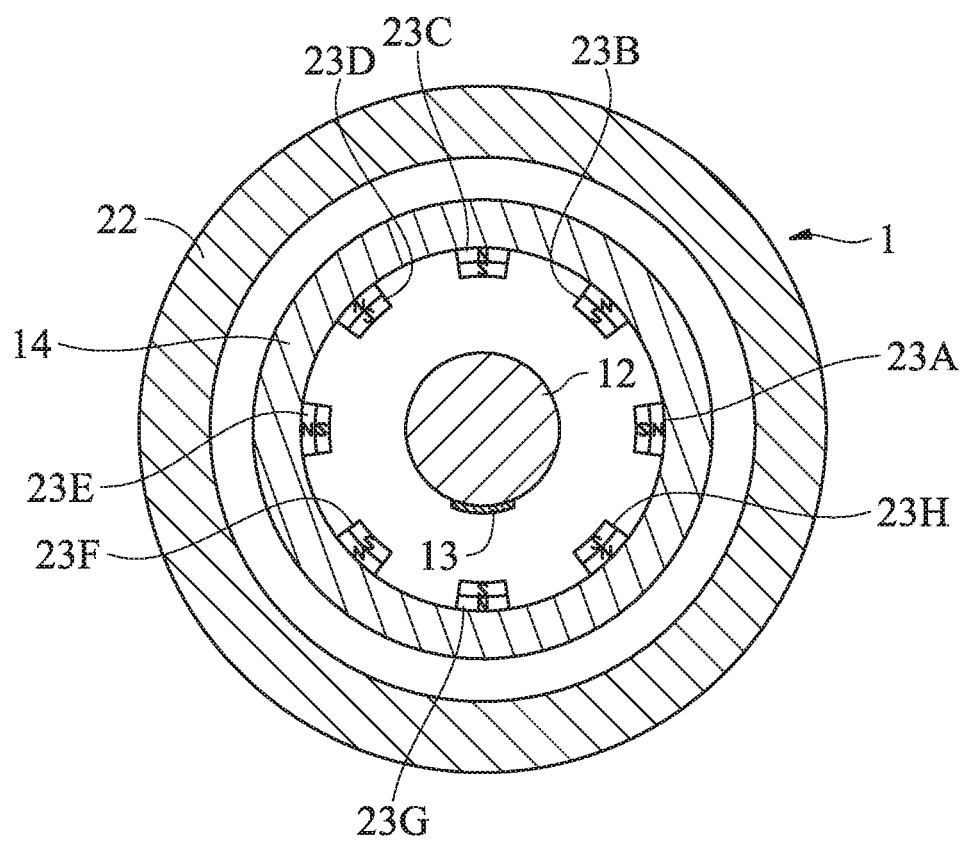
FIG. 7B is a plan view showing the cross section of the dial device of FIG. 7A taken along line E-E'.

FIG. 7A is a longitudinal sectional view showing a dial device in accordance with another embodiment of the present invention. FIG. 7B is a plan view showing the cross section of the dial device of FIG. 7A taken along line E-E'. In the present embodiment, the detailed structure of the dial device 1 is as shown in FIGS. 7A and 7B. The magnet 23 of the foregoing embodiment is modified by a plurality of magnets 23A to 23H having different magnetic field strengths, and the side wall 14 is set to a uniform thickness. The rest of the structure is the same as that of the embodiment of FIGS. 6A and 3B, and the same element symbol is denoted. As shown in FIG. 7B, eight magnets 23A to 23H having different magnetic field strengths are arranged at equal intervals in the circumferential direction of the inner wall surface of the side wall 14 of the base 10 in order of magnetic field strength. Each of the magnets 23A to 23H faces the column 12 with the S pole of the magnet. Although the distance between the magnets 23A to 23H and the magnetic sensor 13 is not changed, since the magnetic field strength of each of the magnets 23A to 23H itself is different, the magnetic sensor 13 can also sense an enhanced or weakened magnetic signal when the dial device 1 is rotated. Therefore, according to the same manner as the embodiment of FIGS. 6A and 6B, the signal processing circuit determines that the dial device 1 is rotated counterclockwise or clockwise (i.e., in FIG. 7B, the cover 20 is rotated counterclockwise or clockwise relative to the base 10) and outputs a counterclockwise rotation or a clockwise rotation signal to the external device. In other embodiments, the number of magnets may also be increased or decreased according to different design considerations. The magnets may be arranged at different intervals on the inner wall surface of the side wall 14 of the base 10 in order of magnetic field strength. In other embodiments, a plurality of magnets of the same magnetic field strength may also be disposed on the side wall 14 of the base 10, and the thickness of the side wall 14 is set to be uneven (as shown in FIG. 6B). This can also achieve the technical effects of the above embodiments.

In the above embodiment, the dial device 1 may not be provided with a push switch. By appropriately setting the position between the magnet and the magnetic sensor, when the cover 20 is pressed to approach the base 10, the relative position of the magnetic sensor 13 and the magnet is misplaced. At this time, the signal processing circuit determines that the relative position of the cover 20 and the base 10 are relatively close according to the output voltage of the magnetic sensor 13, and outputs a pressing signal. For example, when the cover 20 is pressed, the magnetic sensor 13 does not sense the magnetic field strength; or when the cover 20 is pressed, the magnetic sensor 13 senses a different magnetic field strength which is not from the magnet 23 (for example, setting a magnetic field strength to be stronger than the maximum magnetic field strength of the magnet 23 or weaker than the minimum magnetic field strength of the magnet 23).

Figure 8:
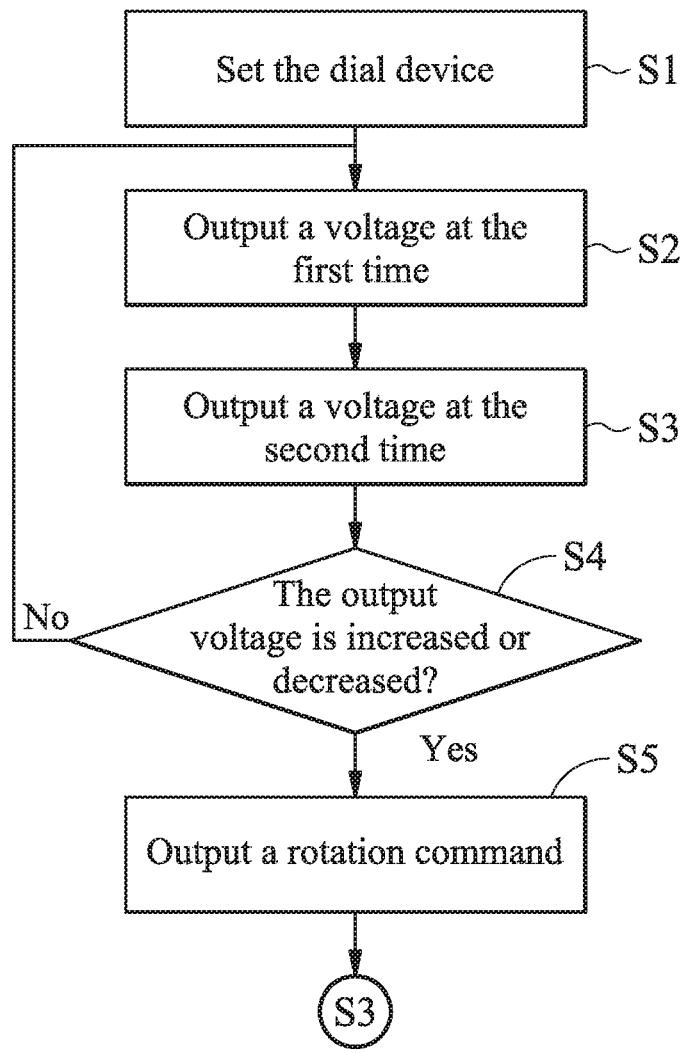
FIG. 8 is a flow chart showing the motion-detection method of the dial device according to the above embodiments.

Next, a motion-detection method for detecting the dial device of the present invention will be described. FIG. 8 is a flow chart showing the motion-detection method of the dial device according to the above embodiments. As shown in FIG. 8, in step S1, the dial device is placed on an external device having a touch screen and a connection is established. In step S2, the magnetic sensor performs magnetic sensing and outputs a voltage. Next, the process proceeds to step S3 to perform the next magnetic sensing, and the magnetic sensor outputs a voltage. Then, in step S4, it is judged whether or not the output voltage has increased or decreased in accordance with the voltage output in step S3 and the voltage output in step S2. If the voltage has not changed or the amount of change does not exceed a preset threshold value, then the process returns to step S2. If the voltage has increased or decreased, it means that the dial device has been rotated. The rotation command is output to the external machine in step S5, and the process returns to step S2 to continue the magnetic sensing. Here, the rotation command representing the rotation in a first direction (for example, the counterclockwise direction) may be output to the external device according to the increase of the output voltage, and the rotation command representing the rotation in a second direction (for example, the clockwise direction) may be output to the external device according to the decrease of the output voltage.

According to the above dial device and the motion detection method thereof, the invention increases the ways to operate the dial device, greatly improving the functionality and convenience of the dial device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A dial device, comprising
a base;
a cover comprising a cap portion and a side wall vertically extending from the cap portion;
a column surrounded by the side wall and including a first end for connecting to the base and a second end for connecting to the cover.
one or more magnets surrounding the column and disposed on the base or the cover;
a magnetic sensor disposed on a side surface of the column; and
a signal processing circuit coupled to the magnetic sensor,
wherein when the cover rotates relative to the base, the one or more magnets will rotate around the column and the magnetic sensor, and the signal processing circuit will sense a plurality of magnetic signals having different values accordingly, and
the signal processing circuit determines a relative rotation direction between the cover and the base according to the plurality of magnetic signals sensed by the magnetic sensor, and outputs a clockwise rotation signal or a counterclockwise rotation signal.
2. The dial device as claimed in claim 1, wherein the one or more magnets comprise a first magnet that spirally surrounds the column and is disposed on at least one of the base and the cover.
3. The dial device as claimed in claim 1, wherein the one or more magnets comprise a plurality of second magnets having substantially the same magnetic field strength, and the plurality of second magnets spirally surround the column and are disposed on at least one of the base and the cover.
4. The dial device as claimed in claim 1, wherein the one or more magnets comprise a plurality of third magnets surrounding the column, the plurality of third magnets being substantially the same distance from the column and being disposed on at least one of the base and the cover,
magnetic field strengths of the plurality of third magnets appear to monotonically increase in a clockwise direction or monotonously decrease in a clockwise direction.
5. The dial device as claimed in claim 1, wherein the column is fixedly connected to the base and rotatably connected to the cover,
the one or more magnets are disposed around the column and are disposed on the cover, and
when the cover rotates relative to the base, the one or more magnets rotate relative to the column and the magnetic sensor.

6. The dial device as claimed in claim 1, wherein the column is fixedly connected to the cover and rotatably connected to the base, the one or more magnets are disposed around the column and disposed on the base, and when the cover rotates relative to the base, the one or more magnets rotate relative to the column and the magnetic sensor.

7. The dial device as claimed in claim 1, further comprising:

a push switch electrically connected to the signal processing circuit and disposed between the cover and the column, when the cover is pressed to approach the base, the push switch is triggered, and the signal processing circuit determines that the push switch is triggered and outputs a pressing signal.

8. The dial device as claimed in claim 1, further comprising:

a push switch electrically connected to the signal processing circuit and disposed between the column and the base, when the cover is pressed to approach the base, the push switch is triggered, and the signal processing circuit determines that the push switch is triggered and outputs a pressing signal.

9. The dial device as claimed in claim 1, wherein when the cover is pressed close to the base, the relative position of the magnetic sensor and the one or more magnets is misplaced, and the signal processing circuit determines that the cover and the base are relatively close to each other by using the plurality of magnetic signals sensed by the magnetic sensor, and outputs a pressing signal.

\* \* \* \* \*